US006717787B2

(12) United States Patent  
Barker

(10) Patent No.: US 6,717,787 B2
(45) Date of Patent: Apr. 6, 2004

(54) CURRENT SENSING IC WITH RESISTIVE SENSING

(75) Inventor: Richard J. Barker, Stockport (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 47 days.

(21) Appl. No.: 10/068,920

(22) Filed: Feb. 7, 2002

(65) Prior Publication Data

US 2002/0114116 A1 Aug. 22, 2002

(30) Foreign Application Priority Data

Feb. 22, 2001 (GB) .............................. 0104353
Nov. 6, 2001 (GB) .............................. 0102598

(51) Int. Cl.[7] .............................................. H02H 3/08
(52) U.S. Cl. ...................................... 361/93.7; 327/309
(58) Field of Search ......................... 323/277; 361/93.7, 361/93.1, 18; 327/309, 427, 539, 530, 566

(56) References Cited

U.S. PATENT DOCUMENTS 5,621,601 A    4/1997    Fujihira et al. ............... 361/93
5,796,278 A    8/1998    Osborn et al. ............... 327/108
6,011,413 A    1/2000    Hayakawa et al. ............ 327/51
6,181,186 B1 *  1/2001    Itoh et al. .................... 327/309
6,269,011 B1 *  7/2001    Ohshima ..................... 363/50

FOREIGN PATENT DOCUMENTS

EP    0808025 A2    5/1997
WO    WO0062422    4/2000
WO    WO0062422    10/2000

* cited by examiner

Primary Examiner—Shawn Riley
(74) Attorney, Agent, or Firm—Aaron Waxler

(57) ABSTRACT

A power MOSFET has a main current carrying section and a sense current carrying section, with separate source electrodes. The source electrode of the main section is connected to the device source terminal. The source electrode of the sense section is connected through a current sensing resistance to the same terminal. Both sections have separate gate electrodes. By comparing a reference voltage with the sense voltage across the sensing resistance, a first control signal is provided for the gate electrode of the sense section. A control circuit includes an adjustment circuit coupled to the first control signal and to the sense voltage and provides a second control signal to the gate electrode of the main section. This second control signal maintains the gate-source voltage of the main section equal to the gate source voltage of the sense section.

10 Claims, 4 Drawing Sheets

CURRENT SENSING IC WITH RESISTIVE SENSING

FIELD OF THE INVENTION

This invention relates to power semiconductor devices, particularly but not exclusively a power semiconductor switch, having a main current carrying transistor section and a sense current carrying transistor section.

The invention also relates to circuit configurations comprised with such a device. The circuit may be used for measuring or modifying or controlling the conduction of the main current carrying section of the device, in relation to an output from the sense current carrying section.

The invention further relates to switching circuits, switching arrangements and switching schemes comprising such a semiconductor device and/or control circuit, particularly but not exclusively as a low-side switch.

The device is typically an insulated-gate field-effect transistor (MOSFET) or an insulated-gate bipolar transistor (IGBT). The device is usually cellular with, for example a close-packed hexagonal, or square or stripe geometry, and so the main current carrying section and the sense current carrying section are generally referred to in terms of main cells and sense cells. The control circuit may be integrated monolithically in the same device body (chip) as the transistor, or it may be in a separate circuit body (IC chip) mounted beside the transistor chip, for example in the same device package (encapsulation).

BACKGROUND OF THE INVENTION

Power MOSFET devices with monolithically integrated control circuits are known. Thus, such devices commercially available from Philips Semiconductors under the trade mark TOPFET include temperature and overload protection functions. TOPFET devices are designed for either high-side or low-side operation, depending on whether used between a power line and the load or the ground line and the load. Such devices are described in the Philips Semiconductors Power MOS Transistors Data Handbook 1997, for example, and on the web-site http://www.semiconductors.philips.com.

In low-side configured MOSFET designs, current limit and current measure functions have difficulty performing well because of the poor tracking between the MOSFET cells that perform the sensing function (sense cells) and the majority of the MOSFET cells (main cells) that are not monitored. This results from the connection of a small measurement resistor to the source of the sense cells, which thereby makes the sense cells non-representative of the main population.

In high side technologies this problem can be resolved by feeding the sense cells into a "virtual earth" node, and hence reducing the difference in source voltages between sense cells and non-sensing main cells of the MOSFET. However, the use of a virtual earth technique in a fast current limit control application is particularly challenging from a stability standpoint.

A virtual earth solution cannot be implemented for low-side MOSFET devices, because there is no means to sink the significant sense current, below source potential. The only strategy believed to be available in low-side technology was to reduce the magnitude of the signal developed across the sense resistor.

U.S. Pat. No. 5,621,601 discloses apparatus designed to prevent the oscillation which often occurs in an over-current protection apparatus for an insulated gate controlled transistor. The apparatus improves the response in current detection, to prevent oscillation, and improves protection speed against over-current. This is accomplished by separating the gates of the main transistor and the current detector transistor, by setting a shorter time constant for the gate circuit of the current detector transistor than that of the gate circuit of the main transistor; by feeding the detection signal obtained from a current detecting resistor which detects the current of the current detector transistor to a control circuit; and by controlling the gate potentials of both transistors to protect the main transistor from the over-current by feeding the comparison output from a comparator circuit, which compares the voltage of the detection signal with a reference voltage, to the control circuit.

One disadvantage of the apparatus disclosed in U.S. Pat. No. 5,621,601 is that it does not take account of the drive impedance presented by the drive circuit acting on the main transistor. For slow switching time devices where the real value of the gate resistor for the main transistor is high compared to the source impedance that can be released in the drive circuit, this arrangement will produce a useful benefit in stability; but for fast switching time devices where this is not the case, the stability advantages will be limited.

However, more important in relation to the present invention is that the disclosure of U.S. Pat. No. 5,621,601 in no way addresses the problem that as a result of connection of the current detecting resistor (the measurement resistor) to the current detector transistor (the sense cells), this detector transistor is not fully representative of the main transistor (the main cells).

SUMMARY OF THE INVENTION

According to the present invention there is provided a power semiconductor device having a main current carrying transistor section integrated with a sense current carrying transistor section for carrying a current which is smaller than and indicative of the current carried by the main current carrying section, wherein the main transistor section and the sense transistor section have a common first main electrode connected to a first main terminal of the device, wherein the main transistor section and the sense transistor section have separate second main electrodes with the second main electrode of the main transistor section connected to a second main terminal of the device and the second main electrode of the sense transistor section connected through a current sensing resistance to said second main terminal of the device, wherein the main transistor section and the sense transistor section have separate control electrodes, wherein control means includes comparison means for comparing a reference voltage defining a current limit value with the voltage across the current sensing resistance and providing a first control signal, wherein the first control signal is coupled to the control electrode of the sense transistor section, and wherein the first control signal is coupled to further control means which provides a second control signal coupled to the control electrode of the main transistor section. In accordance with the present invention, such a device is characterised in that the further control means comprises adjustment circuit means coupled to the first control signal and to the voltage across the current sensing resistance and arranged to provide the second control signal such that the second control signal is effective to maintain the voltage between the control electrode and the second main electrode of the main transistor section equal to the voltage between the control electrode and the second main electrode of the sense transistor section.

The characterising features of the present invention, as defined above, provide correction of the drive to the control electrode of the main transistor section for the reduction in drive voltage applied to the sense transistor section as a result of the current sensing resistance.

Thus, the control electrode of the sense transistor section is connected to the control means so as to define the voltage on this control electrode such that the current in the sense transistor section never exceeds the intended maximum value, and the maximum voltage applied to the sense transistor section control electrode is defined, this nodal connection being the first control signal. The control means compares the reference voltage (defining an intended current limit) with the voltage across the current sensing resistance and so controls the voltage across the current sensing resistance such that it never exceeds the reference voltage. The control means also defines the maximum voltage that is to be applied to the control electrode of the sense transistor section when the external condition applied between the two main electrodes of the device defines the current that is flowing. The adjustment circuit means of the further control means compares the first control signal voltage (the voltage on the control electrode of the sense transistor section) with the voltage on the second main electrode of the sense transistor section to produce the second control signal substantially equal to the voltage that actually appears between the control electrode and second main electrode of the sense transistor section but referenced to the second main electrode of the main current transistor section. It should be noted that this referencing connection relies on a physical connection between the second electrode of the main transistor section and the end of the current sensing resistance that is connected to the second main terminal of the device. This physical connection is apparent in the above definition of the present invention.

In a first, preferred, arrangement according to the present invention the second control signal provided by the adjustment circuit means is connected indirectly to the control electrode of the main transistor section as a third control signal via a buffer driver circuit. An advantage of this preferred arrangement is that a primary, critical, control loop including the comparison means, the sense transistor section and the current sensing resistance is completely isolated from design compromises which would be caused if it had to drive the large inter-electrode capacitances of the main transistor section.

In this preferred arrangement, the buffer driver circuit may include an operational amplifier, a non-inverting input of this operational amplifier being connected to the second control signal voltage, and an inverting input of this operational amplifier being connected to its output and to the control electrode of the main transistor section, and the comparison means may include an operational amplifier, a non-inverting input of this operational amplifier being connected to the current limit defining reference voltage, an inverting input of this operational amplifier being connected to the second main electrode of the sense transistor section, and the output of this operational amplifier being connected to the control electrode of the sense transistor section.

In this preferred arrangement, the adjustment circuit means is a first functional block which operates as a corrected reference voltage generator, this corrected reference voltage, with respect to the main transistor section second main terminal (source terminal for a MOSFET) being substantially equal to the actual voltage that appears between the control electrode and second main terminal (gate and source connections for a MOSFET) of the sense transistor section and will be valid either when the device current is being controlled by the potential across the device or when the device is actually limiting the current. This corrected reference voltage (the second control signal) is then utilized by the buffer driver circuit acting as a second, high-speed, functional block to drive the main transistor section. Separate driving of the control electrodes (gates) of the main and sense transistor sections has the advantage that it alters the drive requirements for the separate, primary, more critical control loop circuit including the sense transistor section, and makes the engineering of a stable current limit circuit a lot simpler. Thus, the preferred arrangement is particularly suitable for use in precision current limit and current measure functions.

In this preferred arrangement, the adjustment circuit means may include an operational amplifier, first and second equal value resistors and a transistor, wherein a non-inverting input of this operational amplifier is connected to the voltage across the current sensing resistance, wherein one end of said first resistor is connected to the second main terminal of the device and the other end of said first resistor is connected to an inverting input of this operational amplifier and to a first main electrode of this transistor, wherein one end of said second resistor is connected to the first control signal voltage and the other end of said second resistor is connected to a second main electrode of this transistor which provides the second control signal, and wherein the output of this operational amplifier is connected to a control electrode of this transistor.

In a second, non-preferred, arrangement according to the present invention the adjustment circuit means is a differential amplifier circuit, and the second control signal is provided by the differential amplifier circuit and is connected directly to the control electrode of the main transistor section. The differential amplifier circuit may include an operational amplifier, wherein a non-inverting input of this operational amplifier is connected to a junction in a first resistive divider which is provided between the first control signal voltage and the second main terminal of the device, wherein an inverting input of this operational amplifier is connected to a junction in a second resistive divider which is provided between the output of this operational amplifier and the voltage across the current sensing resistance, and wherein the output of this operational amplifier provides the second control signal. The comparison means in this second, non-preferred, arrangement may include an operational amplifier, wherein a non-inverting input of this operational amplifier is connected to the current limit defining reference voltage, wherein an inverting input of this operational amplifier is connected to the voltage across the current sensing resistance, and wherein the output of this operational amplifier provides the first control signal.

Thus in this second, non-preferred, arrangement the two functional blocks (preferably using two operational amplifiers) of the further control means of the first, preferred, arrangement can be combined into one compound functional block (preferably using one operational amplifier in a differential amplifier configuration) but the performance will be inferior because the best circuit topology is not used for either function and the hybrid topology is compromised (for example by the limited common mode rejection ratio of such circuits). The simple differential correction can be of significance where an improved current measure precision is required but a sophisticated current limit facility is not implemented.

Thus, the present invention provides a novel device architecture that is suitable, inter alia, for use in precision current limit and current measure functions. The improvement offered by this circuit, in current measure applications, is that the operating conditions pertaining to the main transistor section are a closer approximation to those being seen by the sense transistor section and therefore the current flowing in the sense resistor is more representative of the current in the whole device. This novel device architecture is realisable using either single chip technologies, for example as in the TOPFET (Trade Mark) range of devices, or using multiple chip technologies, as in the SENSEFET range of devices. Such MOSFETs are particularly beneficial for use as low-side switches.

Before describing the details of embodiments of the present invention, it may be explained that the present invention is based on an approach by the inventor which recognizes two components to the "sense ratio" error:

(1) The difference in gate source voltage between the group of sense cells and the cells in the main section of the power MOSFET produces a non-ideal share in response to the transfer function of the component MOSFET cells. This source of error is significant under most conditions.

(2) The non-ideal resistive divider created by the introduction of a small sensing resistor in the source connection of the sense cells also directly generates an error, because it is not matched by a corresponding resistance for the main section of the power MOSFET. This source of error is significant only when the FET is operating fully saturated with a low drain source voltage.

As regards cause (1), the difference in current densities between the sense cells and the main cells can become particularly pronounced at low current densities with the power device running at low levels of enhancement. This is the case when the device is being actively current limited, when the errors from cause (2) are negligible.

As regards cause (2), these errors tend to be worse in devices for "cool running" applications where the drain source operating voltage is very low (i.e. neither fault nor current limiting conditions).

In accordance with the present invention, there is provided a novel approach that facilitates a correction for errors from (1) and that is applicable generally in control applications where the sense ratio error is a problem.

BRIEF DESCRIPTION OF THE DRAWINGS

Embodiments of the invention will now be described in detail with reference to the accompanying drawings, in which.

DETAILED DESCRIPTION OF THE INVENTION

Figure 1:
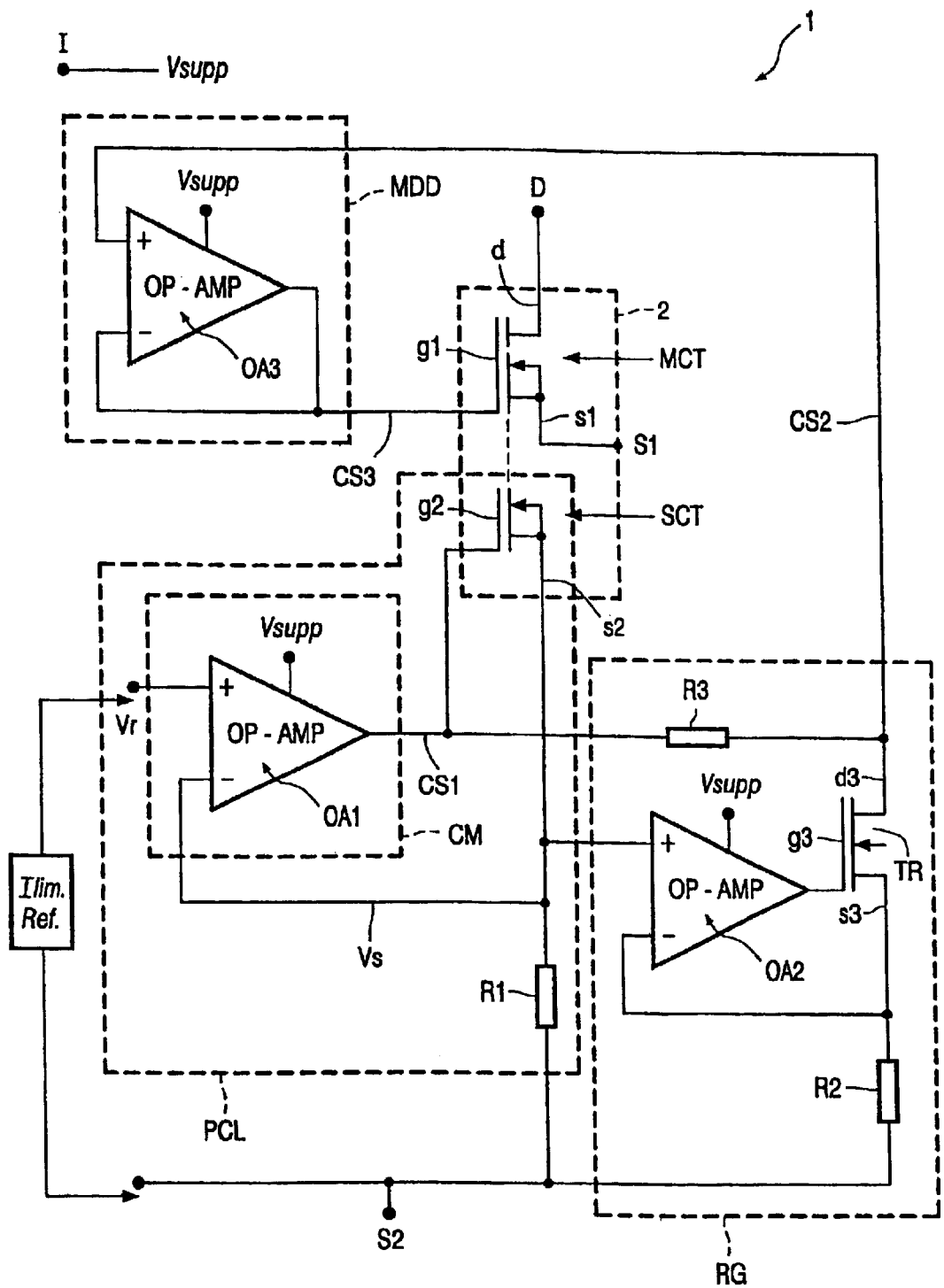
FIG. 1 illustrates a circuit representation of a preferred device in accordance with the present invention incorporating comparison means, a corrected reference voltage generator function block and a buffer driver circuit function block.

Referring now to FIG. 1, a power MOSFET semiconductor device 1 has a main current carrying transistor section MCT integrated 2 with a sense current carrying transistor section SCT for carrying a current which is smaller than and indicative of the current carried by the main current carrying section MCT. The main transistor section MCT and the sense transistor section SCT have a common first main drain electrode d connected to a first main terminal D of the device, the main transistor section MCT and the sense transistor section SCT have separate second main source electrodes s1, s2 with the second source electrode s1 of the main transistor section MCT connected to a second main terminal S1 of the device and the second source electrode s2 of the sense transistor section SCT connected through a current sensing resistance R1 to the second main terminal S2 of the device. The main transistor section MCT and the sense transistor section SCT have separate control gate electrodes g1, g2.

The integrated MOSFET 2 may be, for example, of the trench-gate type or of the DMOS (planar surface MOS) type. Published PCT patent application WO-A-00/62422 (our ref. PHB34338) is, inter alia, an example of the fabrication of a trench-gate power MOSFET with main current carrying and sense current carrying sections, but without the separate individual gate electrodes in accordance with the present invention. The whole contents of WO-A-00/62422 are hereby incorporated as reference material.

A variety of cellular layouts may be adopted for the power MOSFET (both its main current carrying section and its sense current carrying section), for example a close-packed hexagonal, or square or stripe geometry.

Traditionally the sense cell structure has been manufactured with cells in the same MOSFET body with a separate source electrode. The present invention provides also a separate gate electrode. Thus, the invention can exploit the advantages of separate gate and source connections, whilst still maintaining an integrated structure for the main and sense sections so as to ensure thermal and constructional matching. Usually the drain electrode will be common to the sense and main sections, as well as the drain region and drain drift region. The transistor-body regions (channel region) and source regions of the main and sense sections can still be formed in the same process steps, and so may the electrode metallisation. Only the layout pattern of the gate electrodes g1 and g2, their metallisation and connections (if integrated) needs to be changed so as to separate electrically the gate electrodes g1 and g2 of the main and sense sections.

Referring again to FIG. 1, control means CM includes comparison means CM for comparing a reference voltage Vr (defining the intended current limit value) with the voltage Vs across the current sensing resistance R1 and providing a first control signal CS1. The first control signal CS1 is coupled to the gate control electrode g2 of the sense transistor section SCT and the first control signal CS1 is coupled to further control means RG, MDD which provides a second control signal CS2 which is coupled to the gate control electrode g1 of the main transistor section MCT as a third control signal CS3.

The further control means RG, MDD comprises adjustment circuit means RG coupled to the first control signal CS1 and to the voltage Vs across the current sensing resistance R1 and arranged to provide the second control signal CS2. This second control signal CS2 is effective to maintain the voltage between the control (gate) electrode g1 and the second main (source) electrode s1 of the main transistor section MCT equal to the voltage between the control (gate) electrode g2 and the second main (source) electrode s2 of the sense transistor section SCT. The second control signal CS2 is coupled to the control electrode g1 of the main transistor section MCT indirectly via a main device driver MDD which operates as a buffer amplifier to produce the third control signal CS3. The buffer amplifier MDD is engineered to drive the control electrode g1 of MCT in a fast and precise manner, via a low effective output impedance.

The adjustment circuit means RG includes an operational amplifier OA2, two equal value resistors R2 and R3 and an isolated small signal mosfet transistor TR. One terminal point end of R2 is connected to the second main terminal S2 of the device, and the other terminal point end of resistor R2 is connected to the inverting input of the operational amplifier OA2 and to the source electrode of the small signal mosfet transistor TR. One terminal end of R3 is connected to the control signal CS1 voltage and the other terminal end of resistor R3 is connected to the drain electrode of the small signal mosfet TR. The non-inverting input of the operational amplifier OA2 is coupled to the voltage Vs across the current sensing resistance R1. The output of the operational amplifier OA2 is connected to the gate electrode of the small signal mosfet TR. The drain electrode of the small signal mosfet TR defines the signal node producing CS2, the second control signal.

The main device driver circuit portion MDD includes an operational amplifier OA3 arranged to operate as a buffer amplifier for driving the main transistor section MCT, its output being coupled to the gate control electrode g1 of the main transistor section MCT this node being defined as the third control signal CS3. The second control signal CS2 is coupled to a noninverting input of OA3 and the inverting input of OA3 is connected to its output, CS3.

Referring back to the comparison means CM, this includes an operational amplifier OA1 the output of which is used to control the gate electrode g2 of the sense transistor section SCT and so the current flowing in SCT and hence the voltage across R1, the current sense resistor which is in series with SCT. To facilitate this control the non-inverting input of the amplifier OA1 is connected to the reference voltage Vr, which is defined by the reference source IlimRef with respect to S2, and the inverting output of OA1 is connected to the node to be controlled, in this case the junction between R1 and the source electrode s2 of SCT. The output of the amplifier OA1 provides the first control signal CS1, the critical control loop (PCL, primary control loop) so established can now easily be stabiilsed, with appropriate frequency compensation, now the significant inter-electrode capacitance associated with control electrode of MCT is isolated. If this current (limit) control loop is not in its control range (i.e. not defining the current in SCT), the maximum voltage that can appear on the output of amplifier OA1 is constrained to the supply rail voltage Vsupp (see the following explanation with reference to FIGS. 2A and 2B) which would normally be connected either directly or indirectly to the control input I (shown at the top of FIG. 1) of the discrete device 1. The stable reference source IlimRef, would normally be integrated along with the control circuits and would normally have an indirect connection to the control input of the discrete devices.

Figure 2A:
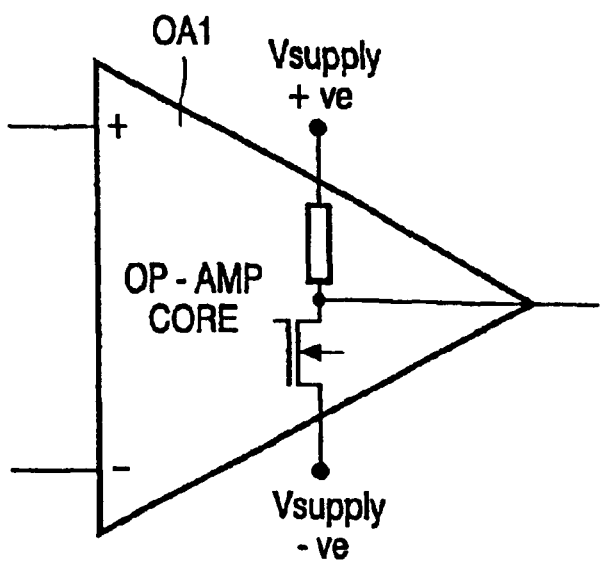
FIGS. 2A and 2B are explanatory illustrations of an operational amplifier in the comparison means of FIG. 1.
Figure 2B:
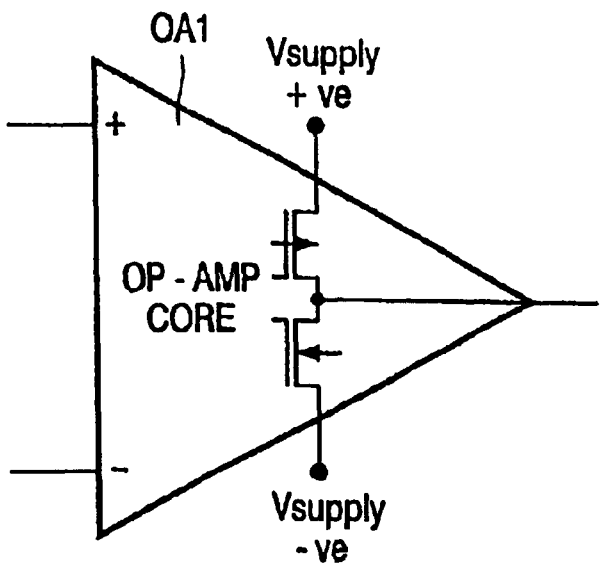

In order to understand the two control output levels of the control means CM described above it is necessary to consider a little about the operational amplifier OA1 functional block and how it may be implemented. FIGS. 2A and 2B show two possible different "output stage" configurations that can be used to implement circuits of this type. Both of these can be considered to have similar properties in that when the +ve input of the amplifier OA1 is substantatially more +ve than the −ve input the output level will swing up to close to the +ve supply rail "Vsupply". It is likely, in the case of FIGS. 2A and 2B, that the output voltage will become substantially equal to the supply rail. This functionality is utilized to achieve the requirement of limiting (defining) the magnitude of the first control signal CS1 when the device 1 is not in current limit.

Referring again to the adjustment circuit means reference generator circuit portion RG shown in FIG. 1, this generates a corrected reference voltage with respect to the MCT source electrode s1 for the main MOSFET transistor section MCT by defining a current flow through the two equal resistors R2 and R3, by controlling the current in the integrated small signal mosfet transistor TR. The reference generator control operational amplifier OA2 adjusts this current (by varying the gate electrode control on TR) such that the voltage developed across resistor R2 is equal to the voltage across the sense resistor R1. Therefore, the voltage across the matched resistor R3 must also be equal to the voltage across the sense resistor R1. This means that the second control signal CS2 voltage that appears on the +ve input of the buffer driver circuit amplifier OA3 with respect to the source terminal S1, is equal to the actual gate-source voltage on the sense transistor section SCT.

Further explanation of the operation of the device shown in FIG. 1 is as follows.

The amplifier OA1, the sense transistor section SCT and the current sensing resistance R1 are comprised in a more critical control loop circuit PCL, whereas the buffer amplifier OA3 which controls the main transistor section MCT is a much less critical control loop. The reason for this differentiation is that the transfer characteristics of SCT are actually enclosed in the control loop of the PCL, since the inverting input of amplifier OA1 is taken to the source electrode s2 of the device, whereas in MDD (main device driver) the inverting input of the buffer amplifier OA3 is taken to the gate control electrode g1. The significance of this becomes very apparent when the device is used to drive an inductive load, in the loop circuit PCL an additional phase shift is introduced since the load inductance can have a marked impact on the load current that actually flows and the voltage that appears across R1 is representative of the load current. Under these circumstances it is advantageous not to be driving the high capacitive load associated with the MCT control electrode. The is better driven by the buffer, where the impact of the high interelectrode capacitance is not such an issue and the impact of the load current is minimal.

The amplifier OA1 is configured as an "integrator" at high speeds to maximize the stability when driving inductive loads. Configuring the amplifier OA1 as an integrator at high speeds, controls the phase shift from the amplifier to 90° for all closed loop gains greater than 1, and hence maximum phase shift in the closed loop PCL under load conditions to less than 180°. Hence the best possible stability is assured.

The arrangement of FIG. 1 has several advantages. Good current limit precision is achievable. This is because the error in the gate-source voltages applied to the reference (sense) cell array SCT and the main MOSFET array MCT is a function of the RMS sum of the offset voltages of the three precision amplifiers OA1, OA2, OA3 of FIG. 1, rather than the amplitude of the sense current signal. This can result in a high level of precision for low-side current limit and current measure applications, for both MOSFETs in the TOPFET (Trade Mark) range and for other MOSFETs.

Although not shown in FIG. 1, it is also advantageous to implement some protection functions (such as over-voltage) on the main MOSFET array only.

Figure 3:
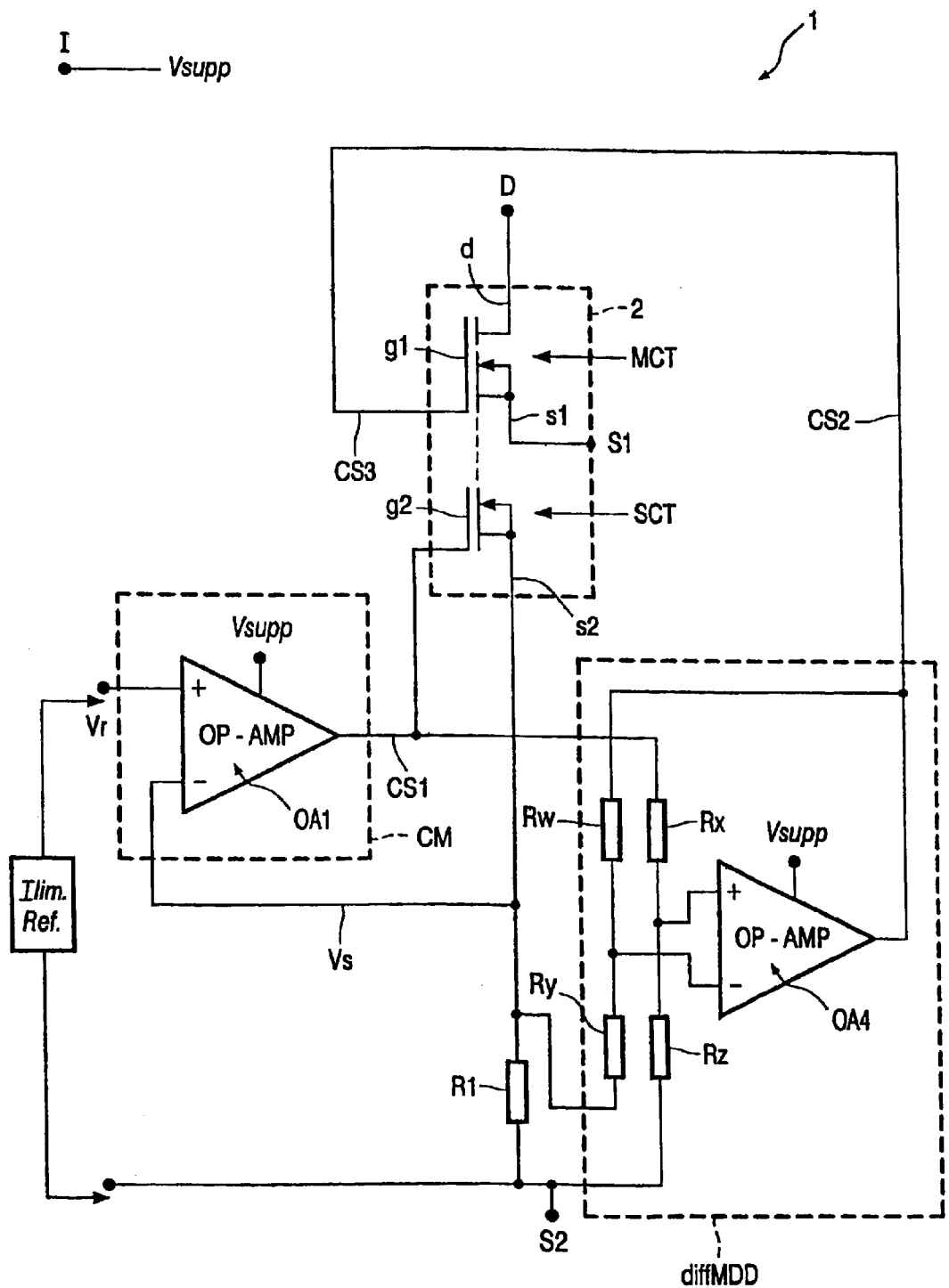
FIG. 3 illustrates the device of FIG. 1 modified in that the two function blocks are combined in a single compound differential amplifier circuit of the device, and FIGS. 4A and 4B schematically illustrate respectively a single integrated circuit chip version and a multiple chip version of the device.

Referring now to FIG. 3, this shows the device 1 of FIG. 1 modified in that the circuit portions RG and MDD are combined in a single circuit portion of the device 1, and this combined circuit portion takes the form of a differential amplifier circuit diffMDD which includes an operational amplifier OA4. A non-inverting input of the operational amplifier OA4 is coupled to the first control signal voltage CS1 and to the second terminal S2 of the device via a first resistive divider Rx, Rz. A second resistive divider is Rw,Ry provided between the output of OA4 and the voltage Vs across the current sensing resistance R1, and an inverting input of the operational amplifier OA4 is connected to the junction in this second resistive divider Rw, Ry. The output of the operational amplifier OA4 provides the second control signal CS2 directly to the gate electrode g1 of the main transistor section MCT.

Thus, in the alternative architecture of FIG. 3, the corrected reference generator RG and buffer amplifier MDD described as two circuit function blocks with reference to FIG. 1 are here combined into one circuit function block as the differential amplifier diffMDD. This is a simpler circuit configuration, but with an overall performance that will be somewhat worse for all conceivable technologies and components sets. The poorer performance results from the poor common-mode rejection ratio of this circuit and the multiplication of the amplifier input offset voltage. However it will be quite adequate for many applications.

For the specific circuit embodiments illustrated in FIGS. 1 and 2, a variety of MOSFET device configurations are possible in accordance with the invention. These configurations depend on the choice of various factors such as:

- whether the control circuits are integrated in and/or on the same device body as the MOSFET itself, so producing a monolithic integrated device as in the TOPFET (Trade Mark) range; or
- whether the control circuits (when not integrated in and/or on the device body) are nonetheless still encapsulated in the same package as the MOSFET device body, so producing a hybrid device or device module.

Thus, the MOSFET device body may have separate bond pads connected respectively to the separate individual gate electrodes g1 and g2 of the main section and of the sense section of the MOSFET, when the control circuit is not integrated in the MOSFET chip. In this case, the device package may have separate terminal pins connected to these separate bond pads of the gate electrodes g1 and g2 of the main section and sense section, when the control circuits are not encapsulated in the device package.

However, the device package may encapsulate the control circuits, when the control circuits are integrated in and/or on the MOSFET chip or when the control circuit is formed in one or more circuit bodies (IC chips) mounted side-by-side with the MOSFET chip. The separate individual gate electrodes g1 and g2 of the main section and of the sense section of the MOSFET can be directly connected with respective elements of the control circuit by means of conductor tracks, when at least parts of the control circuits are integrated in and/or on the MOSFET chip. Otherwise, bond wires may be connected between bond pads of the MOSFET chip and bond pads of a control circuit chip.

Figure 4A:
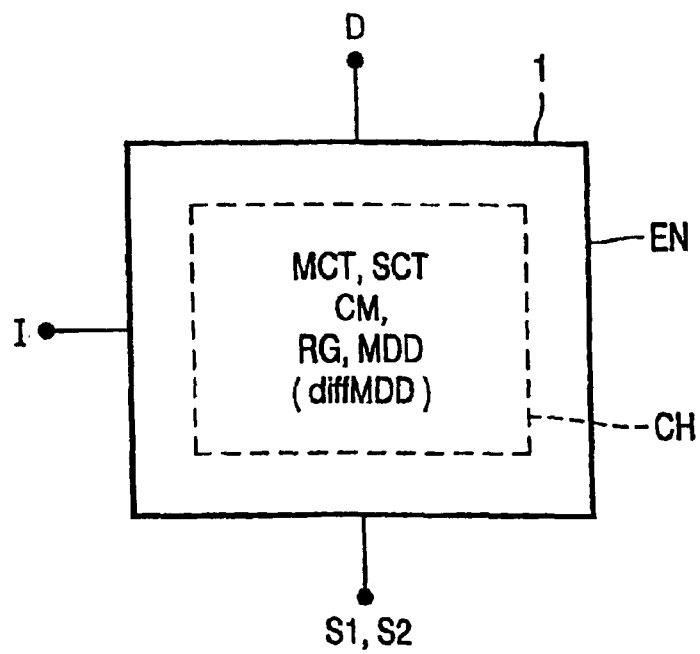
Figure 4B:
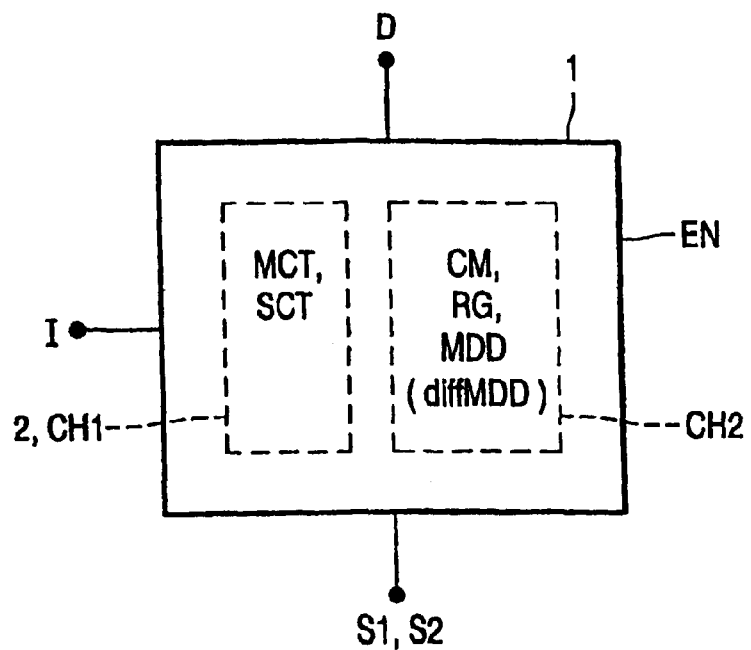

Examples of device packaging for the present invention are shown in FIGS. 4A and 4B which schematically illustrate respectively a single integrated circuit chip version and a multiple chip version of the device. FIG. 4A shows that, within an encapsulation EN for the device 1, the main transistor section MCT, the sense transistor section SCT, the control means CM and the further control means RG, MDD; or diffMDD are provided as a single integrated circuit chip CH. The main device terminal D, the input control terminal I, and the second main device terminals S1 and S2 are shown external to the encapsulation. In this case, the terminals S1 and S2 which are shown separately in FIGS. 1 and 2 are brought out to a single external terminal. FIG. 4B shows that, within an encapsulation EN for the device 1, the main transistor section MCT and the sense transistor section SCT are provided as a first integrated circuit chip 2, CH1, and the control means CM and the further control means RG, MDD; or diffMDD are provided as at least one second integrated circuit chip CH2.

The above disclosure of the invention is primarily in terms of a "low-side" switch. However, features of the present invention may also be applied to a "high-side" switch and are particularly advantageous for a fast current-limit control application of the "high-side" switch.

The above disclosure of the invention is mainly written in terms of a MOSFET type device. However the invention may be applied to other types of semiconductor device, for example to other FETs or to bipolar transistors or to IGBTs.

In the case of other types of field-effect transistor, for example, the insulated gate may be replaced by so-called Schottky gate technologies. In this case, the gate dielectric layer is omitted and the conductive gate electrode forms a Schottky barrier with the lowly-doped channel-accommodating area of the transistor body region. In another FET type, the source regions could be formed as Schottky contact regions rather than as dopant diffused or implanted regions.

A bipolar transistor has emitter and collector (instead of source and drain), and a base (instead of the gate). An IGBT has cathode and anode (instead of source and drain), but its control electrode is still an insulated gate. Each of these device types can be configured with a main current carrying section and a sense current carrying section, the current paths of which extend between first and second electrodes of the device. The second electrode (drain or anode or collector) is usually common to both the main and sense sections. The first electrode (source or cathode or emitter) of the main section is separate from that of the sense section, so that a sense current output can be derived from the separate first electrode of the sense section. The main and sense sections have individual separate respective control electrodes in accordance with the present invention.

What is claimed is:

1. A power semiconductor device having a main current carrying transistor section integrated with a sense current carrying transistor section for carrying a current which is smaller than and indicative of the current carried by the main current carrying section, wherein the main transistor section and the sense transistor section have a common first main electrode connected to a first main terminal of the device, wherein the main transistor section and the sense transistor section have separate second main electrodes with the second main electrode of the main transistor section connected to a second main terminal of the device and the second main electrode of the sense transistor section connected through a current sensing resistance to said second main terminal of the device, wherein the main transistor section and the sense transistor section have separate control electrodes, wherein control means includes comparison means for comparing a reference voltage defining a current limit value with the voltage across the current sensing resistance and providing a first control signal, wherein the first control signal is coupled to the control electrode of the sense transistor section, wherein the first control signal is coupled to further control means which provides a second control signal coupled to the control electrode of the main transistor section, and wherein the further control means comprises adjustment circuit means coupled to the first control signal and to the voltage across the current sensing resistance and arranged to provide the second control signal such that the second control signal is effective to maintain the voltage between the control electrode and the second main electrode of the main transistor section equal to the voltage between the control electrode and the second main electrode of the sense transistor section.

2. A device as claimed in claim 1, wherein the second control signal provided by the adjustment circuit means is connected indirectly to the control electrode of the main transistor section as a third control signal via a buffer driver circuit.

3. A device as claimed in claim 2, wherein the buffer driver circuit includes an operational amplifier, a non-inverting input of this operational amplifier being connected to the second control signal voltage, and an inverting input of this operational amplifier being connected to its output and to the control electrode of the main transistor section, and wherein the comparison means includes an operational amplifier, a non-inverting input of this operational amplifier being connected to the current limit defining reference voltage, an inverting input of this operational amplifier being connected to the second main electrode of the sense transistor section, and the output of this operational amplifier being connected to the control electrode of the sense transistor section.

4. A device as claimed in claim 2, wherein the adjustment circuit means includes an operational amplifier, first and second equal value resistors and a transistor, wherein a non-inverting input of this operational amplifier is connected to the voltage across the current sensing resistance, wherein one end of said first resistor is connected to the second main terminal of the device and the other end of said first resistor is connected to an inverting input of this operational amplifier and to a first main electrode of this transistor, wherein one end of said second resistor is connected to the first control signal voltage and the other end of said second resistor is connected to a second main electrode of this transistor which provides the second control signal, and wherein the output of this operational amplifier is connected to a control electrode of this transistor.

5. A device as claimed in claim 1, wherein the adjustment circuit means is a differential amplifier circuit, and wherein the second control signal is provided by the differential amplifier circuit and is connected directly to the control electrode of the main transistor section.

6. A device as claimed in claim 5, wherein the differential amplifier circuit includes an operational amplifier, wherein a non-inverting input of this operational amplifier is connected to a junction in a first resistive divider which is provided between the first control signal voltage and the second main terminal of the device, wherein an inverting input of this operational amplifier is connected to a junction in a second resistive divider which is provided between the output of this operational amplifier and the voltage across the current sensing resistance, and wherein the output of this operational amplifier provides the second control signal.

7. A device as claimed in claim 5, wherein the comparison means includes an operational amplifier, wherein a non-inverting input of this operational amplifier is connected to the current limit defining reference voltage, wherein an inverting input of this operational amplifier is connected to the voltage across the current sensing resistance, and wherein the output of this operational amplifier provides the first control signal.

8. A device as claimed in claim 1, wherein the main transistor section comprises a power MOSFET or IGBT.

9. A device as claimed in claim 1, wherein, within an encapsulation for the device, the main transistor section, the sense transistor section, the control means and the further control means are provided as a single integrated circuit chip.

10. A device as claimed in claim 1, wherein, within an encapsulation for the device, the main transistor section and the sense transistor section are provided as a first integrated circuit chip, and wherein the control means and the further control means are provided as at least one second integrated circuit chip.

* * * * *